(12) United States Patent
Tu (10) Patent No.: US 11,476,443 B2
(45) Date of Patent: Oct. 18, 2022

(54) DISPLAY PANEL HAVING THIN FILM ENCAPSULATION LAYER INCLUDING NANOTUBE LAYER

(71) Applicant: Wuhan China Star Optoelectronics Semiconductor Display Technology Co., Ltd., Wuhan (CN)

(72) Inventor: Xin Tu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 214 days.

(21) Appl. No.: 16/652,191

(22) PCT Filed: Nov. 5, 2019

(86) PCT No.: PCT/CN2019/115626
§ 371 (c)(1),
(2) Date: Mar. 30, 2020

(87) PCT Pub. No.: WO2021/042492
PCT Pub. Date: Mar. 11, 2021

(65) Prior Publication Data
US 2021/0408464 A1    Dec. 30, 2021

(30) Foreign Application Priority Data
Sep. 5, 2019 (CN) .......................... 201910837636.4

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01); *H01L 2251/5369* (2013.01)

(58) Field of Classification Search
CPC ............. H01L 51/5253; H01L 51/5256; H01L 51/5259; H01L 51/56
(Continued)

(56) References Cited

U.S. PATENT DOCUMENTS

2011/0132449 A1* 6/2011 Ramadas ................ H01L 51/56
136/256
2014/0179040 A1   6/2014 Ramadas et al.
(Continued)

FOREIGN PATENT DOCUMENTS

CN      102057750      5/2011
CN      102208555      10/2011
(Continued)

*Primary Examiner* — Matthew E. Gordon (57) ABSTRACT

A display panel, a display device, and a method for manufacturing a display panel are provided. The display panel includes a base substrate, an organic light emitting diode (OLED) device layer, and a thin film encapsulation layer, all of which sequentially stacked and disposed. The thin film encapsulation layer includes a first inorganic encapsulation layer, an organic encapsulation layer, and a second inorganic encapsulation layer, all of which are sequentially stacked and disposed. A contact surface between the first inorganic encapsulation layer and the organic encapsulation layer and/or between the second inorganic encapsulation layer and the organic encapsulation layer is provided with a nanotube layer extending into the organic encapsulation layer.

12 Claims, 5 Drawing Sheets

(58) Field of Classification Search
USPC .......................................................... 257/40
See application file for complete search history.

(56) References Cited

U.S. PATENT DOCUMENTS

2014/0234661 A1     8/2014   Allemand et al.
2019/0067639 A1*    2/2019   Jiang ................... H01L 51/5256

FOREIGN PATENT DOCUMENTS

| CN | 107785500   |   | 3/2018 |
|----|-------------|---|--------|
| CN | 108470757   |   | 8/2018 |
| CN | 108470757 A | * | 8/2018 |
| CN | 108564885   |   | 9/2018 |
| CN | 109309116   |   | 2/2019 |

\* cited by examiner

DISPLAY PANEL HAVING THIN FILM ENCAPSULATION LAYER INCLUDING NANOTUBE LAYER

RELATED APPLICATIONS

This application is a National Phase of PCT Patent Application No. PCT/CN2019/115626 having International filing date of Nov. 5, 2019, which claims the benefit of priority of Chinese Patent Application No. 201910837636.4 filed on Sep. 5, 2019. The contents of the above applications are all incorporated by reference as if fully set forth herein in their entirety.

FIELD AND BACKGROUND OF THE INVENTION

The present disclosure relates to a technical field of displays, and particularly to a display panel, a display device, a method for manufacturing a display panel.

Organic light emitting diode (OLED) display technology drastically develops. Since OLED products have the advantages of lightness, thinness, fast response times, wide viewing angles, high contrast, and flexibility, etc., OLED products are attracting more and more attention and have more and more applications. OLED products are mainly applied to mobile phones, tablets, televisions, etc. With the continuous development of this technology, flexible and foldable display panels have become an inevitable development trend.

In order to realize the folding function, a conventional display panel must pass a bending test. However, during the bending process, peeling is liable to occur between an organic layer and an inorganic layer of a encapsulation structure, so that external water oxygen, impurities, etc. may invade inner layers, affect the quality of the inner layers, and cause the encapsulation to fail.

Therefore, in the conventional organic light emitting diode display technology, there is also the problem that due to poor adhesion between the inorganic layer and the organic layer of the thin film encapsulation structure, the inner layers are easily influenced by water vapor and impurities from the outside when subjected to lateral pressure or bending, thereby affecting the quality of the display panel. The problem is in urgent need of improvement.

SUMMARY OF THE INVENTION

Technical problems: The present disclosure relates to a display panel, a display device, and a method for manufacturing a display panel, which are used to solve the problem that due to poor adhesion between the inorganic layer and the organic layer of the thin film encapsulation structure, the inner layers are easily influenced by water vapor and impurities from the outside when subjected to lateral pressure or bending, thereby affecting the quality of the display panel.

Technical solutions: To resolve the above problems, in an aspect of the present disclosure, a display panel is provided and includes a base substrate, an organic light emitting diode (OLED) device layer, and a thin film encapsulation layer, all of which sequentially stacked and disposed;

wherein the thin film encapsulation layer includes a first inorganic encapsulation layer, an organic encapsulation layer, and a second inorganic encapsulation layer, all of which are sequentially stacked and disposed; and a contact surface between the first inorganic encapsulation layer and the organic encapsulation layer and/or between the second inorganic encapsulation layer and the organic encapsulation layer is provided with a nanotube layer extending into the organic encapsulation layer.

In accordance with an embodiment of the present disclosure, the nanotube layer includes a plurality of nanotubes in a array, one end of each of the nanotubes contacts the contact surface between the first inorganic encapsulation layer and the organic encapsulation layer, or contacts the contact surface between the second inorganic encapsulation layer and the organic encapsulation layer, and other end of each of the nanotubes extends into the organic encapsulation layer.

In accordance with an embodiment of the present disclosure, a length of the nanotubes is smaller than a thickness of the organic encapsulation layer.

In accordance with an embodiment of the present disclosure, predetermined angles are defined between the nanotubes and the first inorganic encapsulation layer or between the nanotubes and the second inorganic encapsulation layer, and inclined directions of the plurality of nanotubes are the same or different.

In accordance with an embodiment of the present disclosure, the predetermined angles between the nanotubes and the first inorganic encapsulation layer range from 0 degree to 180 degrees.

In accordance with an embodiment of the present disclosure, material of the first inorganic encapsulation layer, the second inorganic encapsulation layer or the nanotube layer is selected from the group consisting of silicon nitride, silicon oxynitride, silicon oxide, nitrogen silicon carbide, zinc oxide and aluminum oxide; and material of the organic encapsulation layer is selected from the group consisting of acrylic, epoxy, polyimide and silicone.

In accordance with an embodiment of the present disclosure, the nanotube layer formed on the contact surface between the first inorganic encapsulation layer and the organic encapsulation layer is manufactured by chemical vapor deposition; and the nanotube layer formed on the contact surface between the organic encapsulation layer and the second inorganic encapsulation layer is manufactured by nanoimprinting.

In accordance with an embodiment of the present disclosure, the base substrate is a flexible substrate or a rigid substrate.

In accordance with an embodiment of the present disclosure, a cathode layer in the OLED device layer is made of material having a low work function.

In accordance with an embodiment of the present disclosure, the nanotube layer is in a shape of a rectangle, a circle, a rectangular ring, or a circular ring having a plurality of small circular holes.

In accordance with an embodiment of the present disclosure, the first inorganic encapsulation layer and the second inorganic encapsulation layer are doped with a certain amount of metal nanoparticles.

In accordance with an embodiment of the present disclosure, the metal nanoparticles are selected from the group consisting of copper, aluminum, barium, magnesium, platinum, silver or lead.

In the present disclosure, a display device is further provided, and includes a display panel. The display panel further includes a base substrate, an organic light emitting diode (OLED) device layer, and a thin film encapsulation layer, all of which sequentially stacked and disposed; wherein the thin film encapsulation layer includes a first inorganic encapsulation layer, an organic encapsulation layer, and a second inorganic encapsulation layer, all of which are sequentially stacked and disposed; and a contact surface between the first inorganic encapsulation layer and the organic encapsulation layer and/or between the second inorganic encapsulation layer and the organic encapsulation layer is provided with a nanotube layer extending into the organic encapsulation layer.

In the present disclosure, a method for manufacturing a display panel is provided, and includes:

step S10 of providing a base substrate;

step S20 of depositing an OLED device layer on a side of the base substrate;

step S30 of depositing a first inorganic encapsulation layer on a side of the OLED device layer facing away from the base substrate by using silicon nitride, silicon oxynitride, silicon oxide, silicon oxynitride, zinc oxide or aluminum oxide material;

step S40 of sequentially forming an organic encapsulation layer, a nanotube layer, and a second inorganic encapsulation layer on a side of the first inorganic encapsulation layer facing away from the OLED device layer, wherein the nanotube layer is disposed on a contact surface between the first inorganic encapsulation layer and the organic encapsulation layer and/or between the second inorganic encapsulation layer and the organic encapsulation layer, and the nanotube layer extends into the organic encapsulation layer.

In accordance with an embodiment of the present disclosure, the nanotube layer is formed on the contact surface between the first inorganic encapsulation layer and the organic encapsulation layer by chemical vapor deposition, or formed on the contact surface between the organic encapsulation layer and the second inorganic encapsulation layer by nanoimprinting, or a first layer of the nanotube layer is formed on the contact surface between the first inorganic encapsulation layer and the organic encapsulation layer by chemical vapor deposition, and then a second layer of the nanotube layer is formed on the contact surface between the organic encapsulation layer and the second inorganic encapsulation layer by nanoimprinting, wherein the nanotube layer extends into the organic encapsulation layer.

In accordance with an embodiment of the present disclosure, the first inorganic encapsulation layer, the second inorganic encapsulation layer, and the organic encapsulation layer are deposited by using a first mask, the nanotube layer is deposited by using a second mask, and the first mask is different from the second mask.

Technical effect: Compared with the prior art, the display panel, the display device, and the method for manufacturing the same provided by the present disclosure have the following beneficial effects:

1. In the display panel provided by the present disclosure, the nanotube layer is disposed in the organic encapsulation layer. The first inorganic encapsulation layer, or the second inorganic encapsulation layer, or both the first inorganic encapsulation layer and the second inorganic encapsulation layer are tightly bonded to the organic encapsulation layer by capillary action, thereby increasing a contact area therebetween, improving the bonding between the inorganic encapsulation layers and the organic encapsulation layer. Hence, when the display panel is bent or subjected to lateral pressure, the encapsulation layers are not easily peeled off, thereby more effectively protecting the inner layers from external water oxygen, impurities, etc., and improving the quality of the display panel.
2. The nanotube layer may be disposed on a side adjacent to the first inorganic encapsulation layer, on a side adjacent to the second inorganic encapsulation layer, or both on a side adjacent to the first inorganic encapsulation layer and on a side adjacent to the second inorganic encapsulation layer, for further reducing the possibility of peeling occurring between the inorganic encapsulation layers and the organic encapsulation layer.
3. Furthermore, different angles are defined between the nanotube layer and the first inorganic encapsulation layer or between the nanotube layer and the second inorganic encapsulation layer. The angles range from 0 degree to 180 degrees. When the angles between the nanotube layer and the first inorganic encapsulation layer or the second inorganic encapsulation layer are acute angles or obtuse angles, the stability between the inorganic encapsulation layer and the organic encapsulation layer is strong.

BRIEF DESCRIPTION OF THE SEVERAL VIEWS OF THE DRAWINGS

In order to more clearly illustrate the embodiments of the present disclosure or the technical solutions in prior arts, the following briefly introduces the accompanying drawings used in the embodiments. Obviously, the drawings in the following description merely show some of the embodiments of the present disclosure. As regards one of ordinary skill in the art, other drawings can be obtained in accordance with these accompanying drawings without making inventiveness efforts.

DESCRIPTION OF SPECIFIC EMBODIMENTS OF THE INVENTION

The technical solutions in the embodiments of the present disclosure are clearly and completely described as follows with reference to the accompanying drawings in the embodiments. It is apparent that the described embodiments are only a part of the embodiments of the present disclosure, and not all of the embodiments. All other embodiments obtained by a person skilled in the art based on the embodiments of the present disclosure without inventive efforts are within the scope of the present disclosure.

In the description of the present disclosure, it is to be understood that the oriental and the positional relationships of the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc. are based upon the oriental or positional relationship shown in the drawings, are merely for facilitating and simplifying the description of the present disclosure, and do not indicate or imply that the device or components referred to have a specific orientation, and are constructed and operated in a specific orientation. Therefore, it should not be construed as limiting the disclosure. Moreover, the terms "first" and "second" are used for descriptive purposes only and are not to be construed as indicating or implying a relative importance or implicitly indicating the number of indicated technical features. Thus, features defining "first" or "second" may include one or more of the described features either explicitly or implicitly. In the description of the present disclosure, the meaning of "a plurality of" is two or more unless specifically defined otherwise.

In the present disclosure, a display panel, a display device, and a method for manufacturing the same are provided. Specifically, refer to FIG. 1 to FIG. 10.

Currently, thin film encapsulation layers in the field of organic light emitting diode (OLED) display are generally an alternating structure of inorganic encapsulation layer, organic encapsulation layer, and inorganic encapsulation layer. When bending or lateral pressure is applied, the film layers between the inorganic encapsulation layer and the organic encapsulation layer are easily peeled off, resulting in encapsulation failure.

Therefore, in the present disclosure, a display panel, a display device, and a method for manufacturing the same are provided for the phenomenon that the conventional thin film encapsulation layer has poor stability, is easily peeled off, and cannot effectively block external water and oxygen, impurities and the like from invading the inner layers. By utilizing capillary action, a nanotube layer is disposed in the organic encapsulation layer, thereby increasing a contact area between the inorganic encapsulation layers and the organic encapsulation layer, and causing a tight bonding between the inorganic encapsulation layers and the organic encapsulation layer. Hence, when the display panel is bent or subjected to lateral pressure, a risk of peeling occurring between the inorganic encapsulation layer and the organic encapsulation layer is reduced. Secondly, the nanotube layer may be disposed on a side adjacent to the first inorganic encapsulation layer, or on a side adjacent to the second inorganic encapsulation layer, or both on a side adjacent to the first inorganic encapsulation layer and on a side adjacent to the second inorganic encapsulation layer, for further reducing the possibility of peeling occurring between the inorganic encapsulation layers and the organic encapsulation layer. Finally, different angles are defined between the nanotube layer and the first inorganic encapsulation layer or between the nanotube layer and the second inorganic encapsulation layer. The angles range from 0 degree to 180 degrees. When the angles between the nanotube layer and the first inorganic encapsulation layer or the second inorganic encapsulation layer are acute angles or obtuse angles, the stability between the inorganic encapsulation layer and the organic encapsulation layer is strong.

Figure 1:
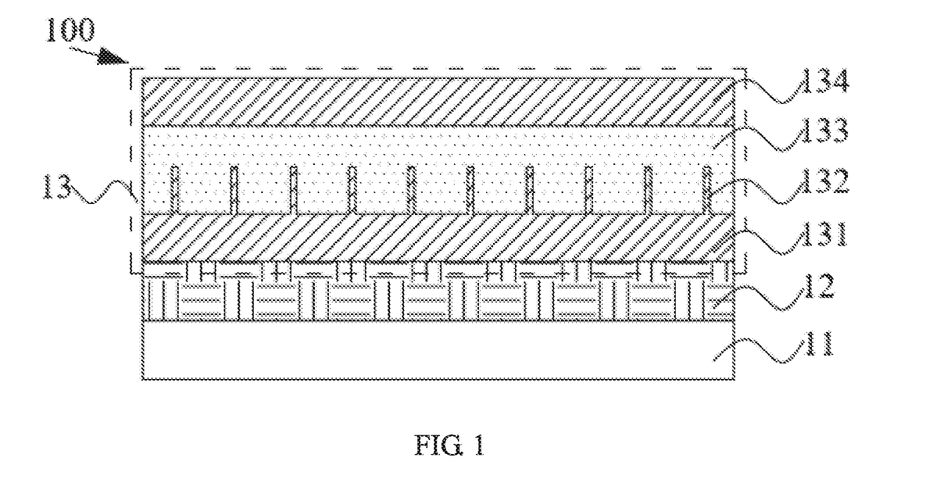
FIG. 1 is a first structural schematic diagram of a display panel in accordance with an embodiment of the present disclosure.

Refer to FIG. 1, which is a schematic structural diagram 100 of a display panel in accordance with an embodiment of the present disclosure. In an embodiment of the present disclosure, the display panel includes a base substrate 11, which may be a rigid substrate, such as a glass substrate or a quartz substrate, or preferably a flexible substrate, such as a resin substrate. The flexible substrate may be a polyimide substrate, a polyamide substrate, a polycarbonate substrate, or a polyether sulfone substrate. In another embodiment of the present disclosure, the base substrate 11 may also be obtained by coating polyimide (PI) onto a clean glass by a coater and then undergoing a high temperature curing process. The PI film has excellent high and low temperature resistance, electrical insulation, adhesion, radiation resistance, and dielectric resistance. The resultant base substrate 11 formed of the PI film has great flexibility.

An organic light emitting diode (OLED) device layer 12 is disposed on one side of the base substrate 11. The OLED device layer 12 includes a cathode layer, an anode layer, a light emitting layer, an electron injection layer, an electron transport layer, a hole injection layer, a hole transport layer, and a barrier layer. Material of the cathode layer may be material with a low work function. Firstly, the efficiency of electron injection may be improved. Secondly, the Joule heat generated during operation of the OLED may be reduced, and the life of the device may be improved. Since the anode layer injects holes into the OLED, the anode layer requires a high work function. Hence, material of the anode layer is generally selected from the group consisting of ITO, IZO, Au, Pt, Si, etc.

A thin film encapsulation layer 13 is disposed on a side of the OLED device layer 12 facing away from the substrate 11. The thin film encapsulation layer 13 is further divided into a first inorganic encapsulation layer 131, an organic encapsulation layer 133, and a second inorganic encapsulation layer 134. The organic encapsulation layer 133 is further provided with a nanotube layer 132.

Figure 2:
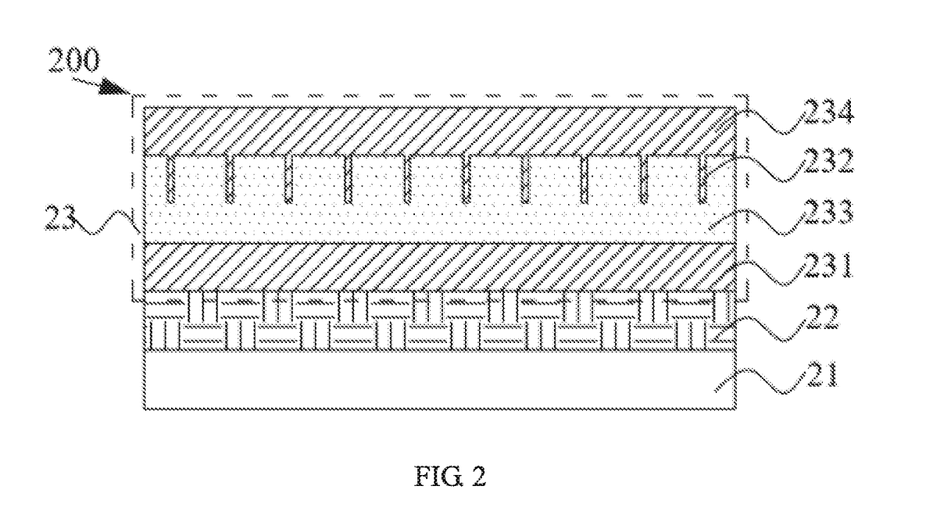
FIG. 2 is a second structural schematic diagram of a display panel in accordance with an embodiment of the present disclosure.
Figure 3:
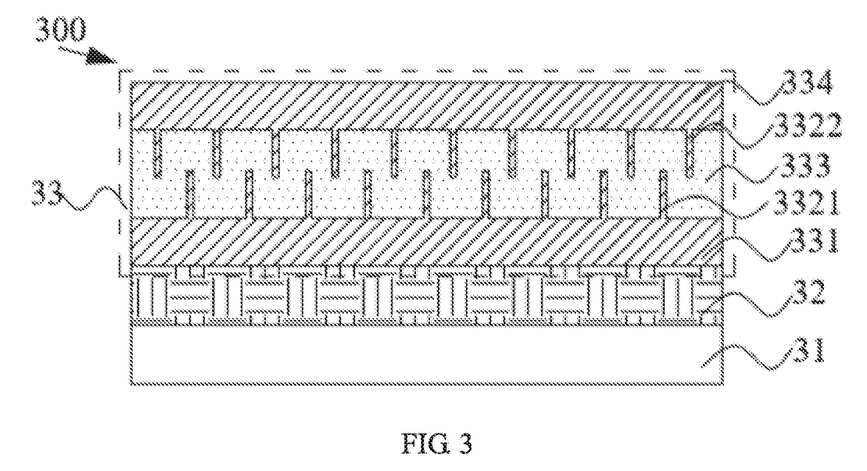
FIG. 3 is a third structural schematic diagram of a display panel in accordance with an embodiment of the present disclosure.

The nanotube layer 132 is formed of a plurality of nanotubes having the same shape, length and width, and a length of the nanotubes is smaller than a thickness of the organic encapsulation layer 133. In an embodiment of the present disclosure, a contact surface between the first inorganic encapsulation layer 131 and the organic encapsulation layer 133 is provided with the nanotube layer 132, which extends into the organic encapsulation layer, and is formed of the same material as material of the first inorganic encapsulation layer 131, as shown in FIG. 1. In another embodiment of the present disclosure, a contact surface between the organic encapsulation layer 233 and the second inorganic encapsulation layer 234 is provided with the nanotube layer 232, which extends into the organic encapsulation layer, and is formed of the same material as material of the second inorganic encapsulation layer 234, as shown in FIG. 2. In another embodiment of the present disclosure, the nanotube layer 332 (not shown) is divided into a first layer of the nanotube layer 3321 and a second layer of the nanotube layer 3322. A contact surface between the first inorganic encapsulation layer 331 and the organic encapsulation layer 333 is provided with the first layer of the nanotube layer 3321. A contact surface between the second organic encapsulation layer 333 and the inorganic encapsulation layer 334 is provided with the second layer of the nanotube layer 3322. Both of the first layer of the nanotube layer 3321 and the second layer of the nanotube layer 3322 extend into the organic encapsulation layer. The material of the nanotube layer 3322 is the same as both the first inorganic layer 331 and the second inorganic layer 334. The bonding between the inorganic encapsulation layer and the organic capsulation layer is further improved, as shown in FIG. 3.

Figure 4:
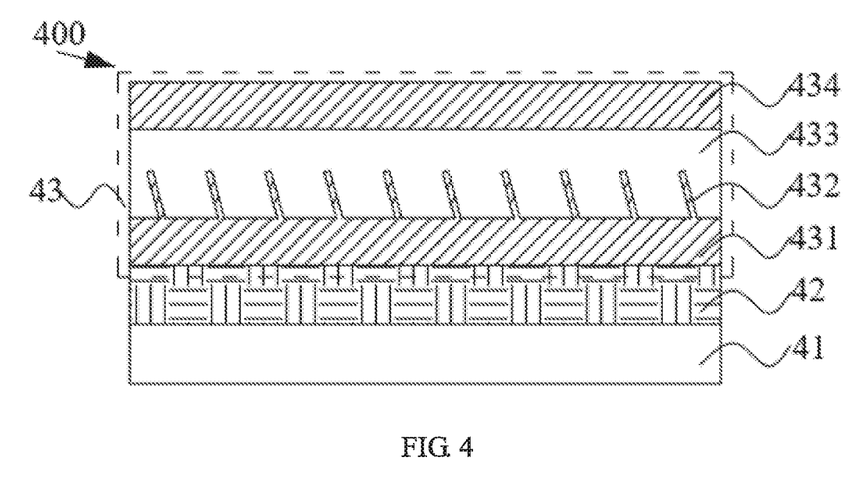
FIG. 4 is a fourth structural schematic diagram of a display panel in accordance with an embodiment of the present disclosure.
Figure 5:
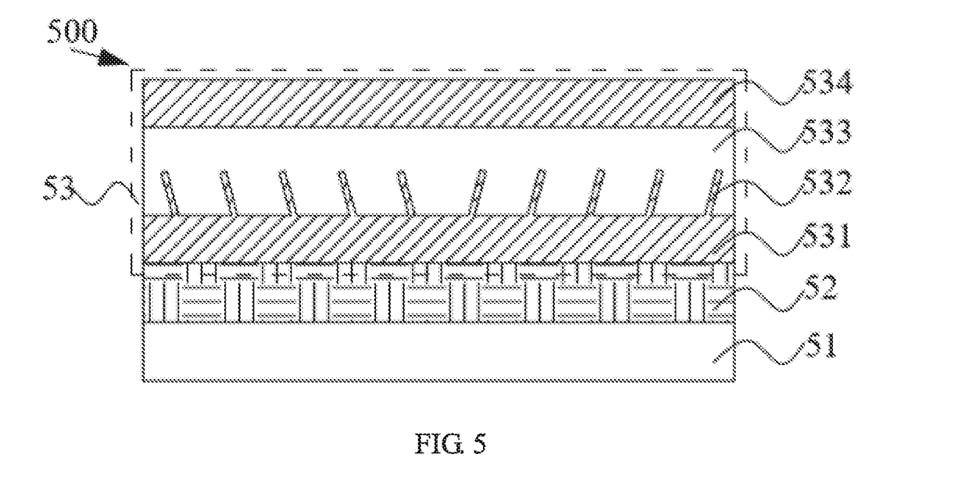
FIG. 5 is a fifth structural schematic diagram of a display panel in accordance with an embodiment of the present disclosure.
Figure 6:
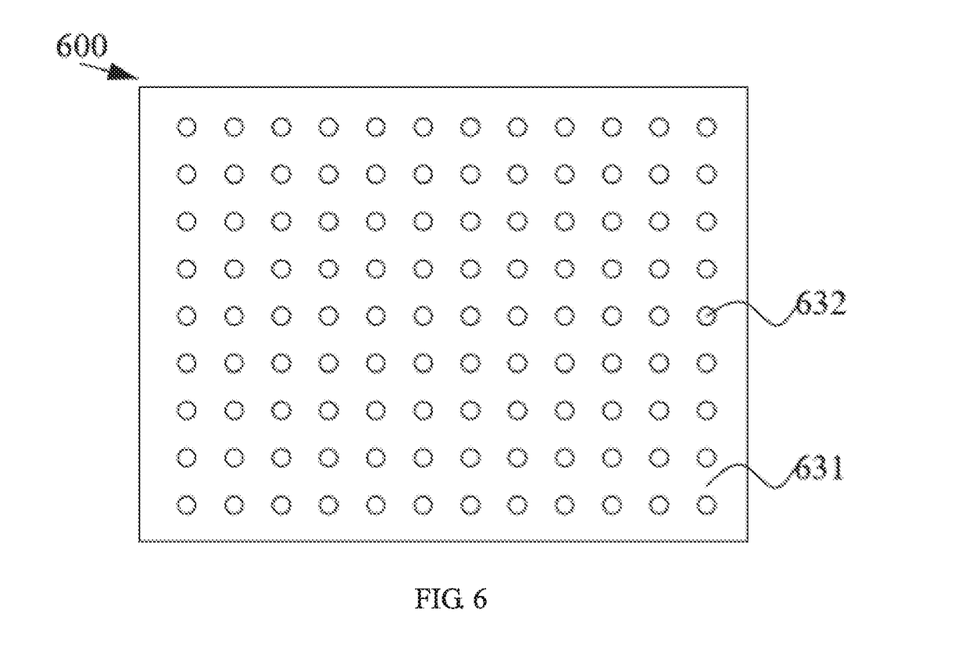
FIG. 6 is a first top view of a nanotube layer of a display panel in accordance with an embodiment of the present disclosure.
Figure 7:
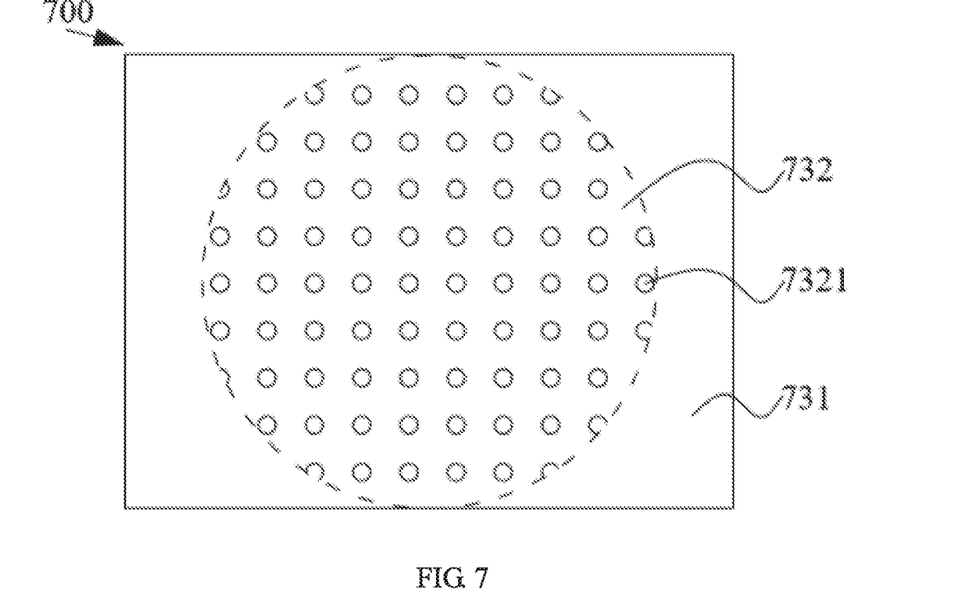
FIG. 7 is a second top view of a nanotube layer of a display panel in accordance with an embodiment of the present disclosure.
Figure 8:
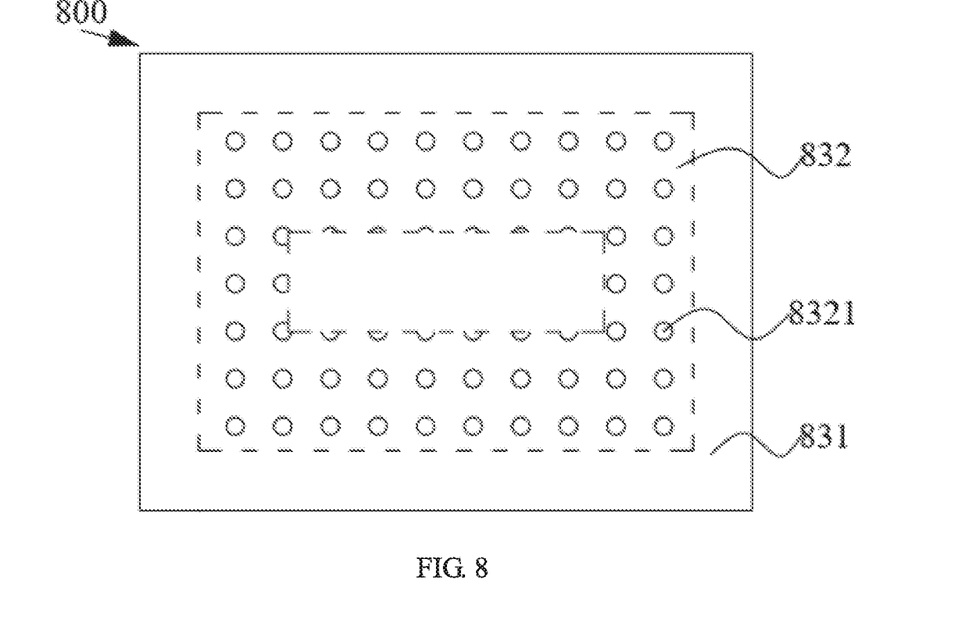
FIG. 8 is a third top view of a nanotube layer of a display panel in accordance with an embodiment of the present disclosure.
Figure 9:
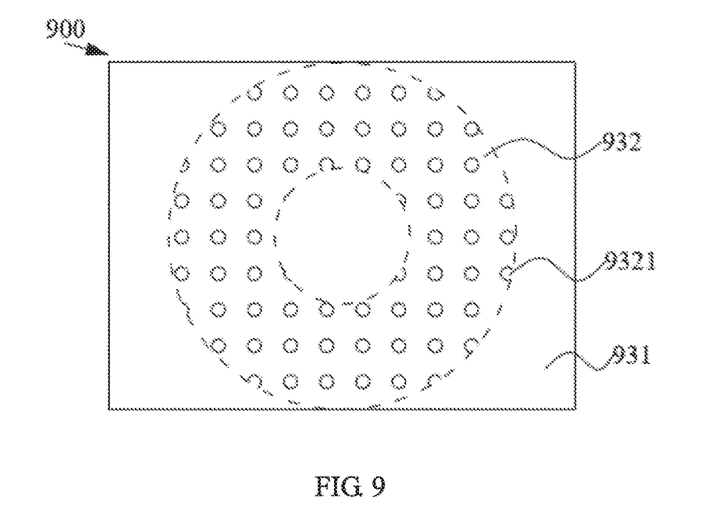
FIG. 9 is a fourth top view of a nanotube layer of a display panel in accordance with an embodiment of the present disclosure.

Furthermore, predetermined angle are defined between the nanotube layer 132 and the first inorganic encapsulation layer 131 or between the nanotube layer 132 and the second inorganic encapsulation layer 134. The predetermined angles range from 0 degrees to 180 degrees. That is, in an embodiment of the present disclosure, the nanotube layer 132 is at right angles to the first inorganic encapsulation layer 131 or the second inorganic encapsulation layer 134. In another embodiment of the present disclosure, the nanotube layer 432 is at acute angles with the first inorganic encapsulation layer 431 or the second inorganic encapsulation layer 434, as shown in FIG. 4. In another embodiment of the present disclosure, the nanotube layer 432 is at obtuse angles to the first inorganic encapsulation layer 431 or the second inorganic encapsulation layer 434 (as viewed from the other side). In one embodiment of the present disclosure, a part of the nanotube layer 532 is at acute angles with the first inorganic encapsulation layer 431 or the second inorganic encapsulation layer 434, and another part of the nanotube layer 532 is at obtuse angles with the first inorganic encapsulation layer 431 or the second inorganic encapsulation layer 434, as shown in FIG. 5.

Furthermore, the material of the nanotube layer 132 is the same as the material of the first inorganic encapsulation layer 131 and the second inorganic encapsulation layer 134, and may be one or a combination of silicon nitride, silicon oxynitride, silicon oxide, or silicon oxynitride, zinc oxide or aluminum oxide. The material of the organic encapsulating layer 133 may be one or a combination of acrylic, epoxy, polyimide or silicone. The first inorganic encapsulation layer 131 or the second inorganic encapsulation layer 134 may be manufactured by chemical vapor deposition (CVD), atomic layer deposition (ALD), pulsed laser deposition (PLD), or magnetron sputtering. The nanotube layer 132 formed on the contact surface between the first inorganic encapsulation layer 131 and the organic encapsulation layer 133 is manufactured by chemical vapor deposition; and the nanotube layer 132 formed on the contact surface between the organic encapsulation layer 133 and the second inorganic encapsulation layer 134 is manufactured by nanoimprinting. The organic encapsulation layer is manufactured by ink jet printing (IJP) or dispensing.

Furthermore, the first inorganic encapsulation layer 131, the second inorganic encapsulation layer 134, and the organic encapsulation layer 133 are deposited by using a first mask, the nanotube layer 132 is deposited by using a second mask, and the first mask is different from the second mask. In an embodiment of the present disclosure, the nanotube layer 632 may be in a shape of a rectangle and disposed on the organic encapsulation layer 631, the nanotube layer 732 may be in a shape of a circle and disposed on the organic encapsulation layer 731 (the reference number 7321 indicates the nanotubes), the nanotube layer 832 may be in a shape of rectangular ring and disposed on the organic encapsulation layer 831 (the reference number 8321 indicates the nanotubes), or the nanotube layer 932 may be in a shape of circle ring and disposed on the organic encapsulation layer 931 (reference number 9321 indicates the nanotubes). That is, during the deposition of the nanotube layer, the mask shape includes a shape of a rectangle, a circle, a rectangular ring, or a circular ring having a plurality of small circular holes, as shown in FIG. 6-FIG. 9.

In an embodiment of the present disclosure, in order to further enhance the strength and toughness of the first inorganic encapsulation layer 131 and the second inorganic encapsulation layer 134, when the first inorganic encapsulation layer 131 and the second inorganic encapsulation layer 134 are being deposited, a certain amount of metal nanoparticles may also be doped therein, and the metal nanoparticles may be one or a combination of copper, aluminum, barium, magnesium, platinum, silver or lead, for preventing cracks from expanding, and effectively improving the brittleness of the materials of the first inorganic encapsulation layer 131 and the second inorganic encapsulation layer 134 in the thin film encapsulation layer 13. In addition, since the metal nanoparticles have desirable thermal conductivity, the heat dissipation performance of the display panel may also be improved.

In the present disclosure, a display device is provided and includes a display panel. The display panel further includes a base substrate, an OLED device layer and a thin film encapsulation layer, all of which are sequentially stacked and disposed. The thin film encapsulation layer is divided into an inorganic encapsulation layer, an organic encapsulation layer, and a second inorganic encapsulation layer, wherein a contact surface between the first inorganic encapsulation layer and the organic encapsulation layer and/or between the second inorganic encapsulation layer and the organic encapsulation layer is provided with a nanotube layer extending into the organic encapsulation layer.

Figure 10:
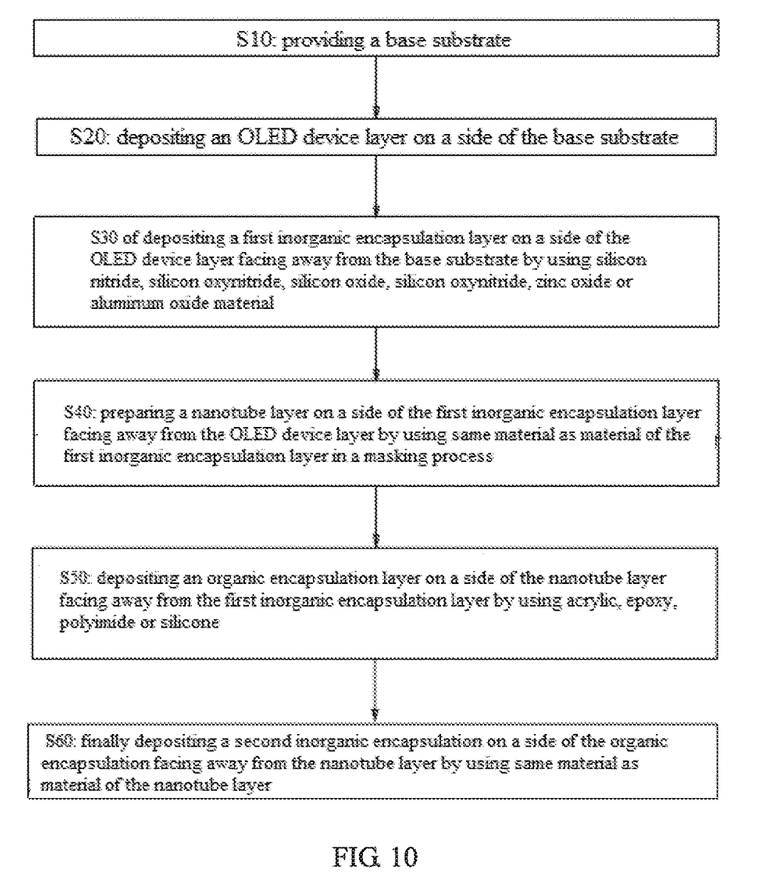
FIG. 10 is a schematic flowchart diagram of a method for manufacturing a display panel in accordance with an embodiment of the present disclosure.

Refer to FIG. 10. In the present disclosure, a method for manufacturing a display panel is further provided, and includes step S10 of providing a base substrate; step S20 of depositing an OLED device layer on a side of the base substrate; step S30 of depositing a first inorganic encapsulation layer on a side of the OLED device layer facing away from the base substrate by using silicon nitride, silicon oxynitride, silicon oxide, silicon oxynitride, zinc oxide or aluminum oxide material; step S40 of sequentially forming an organic encapsulation layer, a nanotube layer, and a second inorganic encapsulation layer on a side of the first inorganic encapsulation layer facing away from the OLED device layer, wherein the nanotube layer is disposed on a contact surface between the first inorganic encapsulation layer and the organic encapsulation layer and/or between the second inorganic encapsulation layer and the organic encapsulation layer, and the nanotube layer extends into the organic encapsulation layer.

In the above step S40, the nanotube layer is formed on the contact surface between the first inorganic encapsulation layer and the organic encapsulation layer by chemical vapor deposition, or formed on the contact surface between the organic encapsulation layer and the second inorganic encapsulation layer by nanoimprinting, or a first layer of the nanotube layer is firstly formed on the contact surface between the first inorganic encapsulation layer and the organic encapsulation layer by chemical vapor deposition, and then a second layer of the nanotube layer is formed on the contact surface between the organic encapsulation layer and the second inorganic encapsulation layer by nanoimprinting, wherein the nanotube layer extends into the organic encapsulation layer.

A display panel, a display device and a method for manufacturing the same are provided in detail in the above embodiments. The principles and the implementations of the present disclosure are described in the specific examples. The description of the above embodiments is only used to facilitate understanding the technical solutions of the present disclosure and the core ideas thereof. Those skilled in the art should understand that the technical solutions described in the foregoing embodiments may be modified, or some of the technical features may be equivalently replaced. However, the modifications or the replacements do not deviate the essence of the corresponding technical solutions from the scope of the technical solutions of the embodiments of the present disclosure.

What is claimed is:

1. A display panel comprising: a base substrate, an organic light emitting diode (OLED) device layer, and a thin film encapsulation layer, all of which sequentially stacked and disposed;
   wherein the thin film encapsulation layer includes a first inorganic encapsulation layer, an organic encapsulation layer, and a second inorganic encapsulation layer, all of which are sequentially stacked and disposed; and a contact surface between the first inorganic encapsulation layer and the organic encapsulation layer and/or between the second inorganic encapsulation layer and the organic encapsulation layer is provided with a nanotube layer extending into the organic encapsulation layer;
   wherein the nanotube layer includes a plurality of nanotubes in an array, one end of each of the plurality of nanotubes contacts the contact surface between the first inorganic encapsulation layer and the organic encapsulation layer, or contacts the contact surface between the second inorganic encapsulation layer and the organic encapsulation layer, and another end of each of the plurality of nanotubes extends into the organic encapsulation layer;
   wherein a length of the plurality of nanotubes is smaller than a thickness of the organic encapsulation layer.

2. The display panel as claimed in claim 1, wherein predetermined angles are defined between the plurality of nanotubes and the first inorganic encapsulation layer or between the plurality of nanotubes and the second inorganic encapsulation layer, and inclined directions of the plurality of nanotubes are the same or different.

3. The display panel as claimed in claim 2, wherein the predetermined angles between the plurality of nanotubes and the first inorganic encapsulation layer range from 0 degree to 180 degrees.

4. The display panel as claimed in claim 1, wherein material of the first inorganic encapsulation layer, the second inorganic encapsulation layer or the nanotube layer is selected from the group consisting of silicon nitride, silicon oxynitride, silicon oxide, nitrogen silicon carbide, zinc oxide and aluminum oxide; and
   material of the organic encapsulation layer is selected from the group consisting of acrylic, epoxy, polyimide and silicone.

5. The display panel as claimed in claim 1, wherein the nanotube layer formed on the contact surface between the first inorganic encapsulation layer and the organic encapsulation layer is manufactured by chemical vapor deposition; and
   the nanotube layer formed on the contact surface between the organic encapsulation layer and the second inorganic encapsulation layer is manufactured by nanoimprinting.

6. The display panel as claimed in claim 1, wherein the base substrate is a flexible substrate or a rigid substrate.

7. The display panel as claimed in claim 1, wherein the nanotube layer is in a shape of a rectangle, a circle, a rectangular ring, or a circular ring having a plurality of small circular holes.

8. The display panel as claimed in claim 1, wherein the first inorganic encapsulation layer and the second inorganic encapsulation layer are doped with a certain amount of metal nanoparticles.

9. The display panel as claimed in claim 8, wherein the metal nanoparticles are selected from the group consisting of copper, aluminum, barium, magnesium, platinum, silver or lead.

10. A display device comprising the display panel as claimed in claim 1.

11. A method for manufacturing a display panel, comprising:
    step S10 of providing a base substrate;
    step S20 of depositing an OLED device layer on a side of the base substrate;
    step S30 of depositing a first inorganic encapsulation layer on a side of the OLED device layer facing away from the base substrate by using silicon nitride, silicon oxynitride, silicon oxide, silicon oxynitride, zinc oxide or aluminum oxide material;
    step S40 of sequentially forming an organic encapsulation layer, a nanotube layer, and a second inorganic encapsulation layer on a side of the first inorganic encapsulation layer facing away from the OLED device layer, wherein the nanotube layer is disposed on a contact surface between the first inorganic encapsulation layer and the organic encapsulation layer and/or between the second inorganic encapsulation layer and the organic encapsulation layer, and the nanotube layer extends into the organic encapsulation layer;
    wherein the nanotube layer includes a plurality of nanotubes in an array, one end of each of the plurality of nanotubes contacts the contact surface between the first inorganic encapsulation layer and the organic encapsulation layer, or contacts the contact surface between the second inorganic encapsulation layer and the organic encapsulation layer, and another end of each of the plurality of nanotubes extends into the organic encapsulation layer;
    wherein a length of the plurality of nanotubes is smaller than a thickness of the organic encapsulation layer.

12. The method for manufacturing the display panel as claimed in claim 11, wherein the nanotube layer is formed on the contact surface between the first inorganic encapsulation layer and the organic encapsulation layer by chemical vapor deposition, or formed on the contact surface between the organic encapsulation layer and the second inorganic encapsulation layer by nanoimprinting, or a first layer of the nanotube layer is formed on the contact surface between the first inorganic encapsulation layer and the organic encapsulation layer by chemical vapor deposition, and then a second layer of the nanotube layer is formed on the contact surface between the organic encapsulation layer and the second inorganic encapsulation layer by nanoimprinting, wherein the nanotube layer extends into the organic encapsulation layer.

* * * * *